United States Patent
Uchida et al.

(10) Patent No.: US 7,532,655 B2
(45) Date of Patent: May 12, 2009

(54) SEMICONDUCTOR LIGHT EMITTING DEVICE AND METHOD OF PRODUCING THE SAME

(75) Inventors: Shiro Uchida, Miyagi (JP); Tsuyoshi Tojo, Miyagi (JP)

(73) Assignee: Sony Corporation, Tokyo (JP)

( * ) Notice: Subject to any disclaimer, the term of this patent is extended or adjusted under 35 U.S.C. 154(b) by 185 days.

(21) Appl. No.: 10/568,786

(22) PCT Filed: Jun. 15, 2005

(86) PCT No.: PCT/JP2005/010928

§ 371 (c)(1),
(2), (4) Date: Feb. 16, 2006

(87) PCT Pub. No.: WO2005/124952

PCT Pub. Date: Dec. 29, 2005

(65) Prior Publication Data

US 2006/0284186 A1 Dec. 21, 2006

(30) Foreign Application Priority Data

Jun. 18, 2004 (JP) ............................. 2004-181111

(51) Int. Cl.
*H01S 5/00* (2006.01)

(52) U.S. Cl. ............... 372/45.01; 372/43.01; 372/46.01

(58) Field of Classification Search .... 372/43.01–50.23
See application file for complete search history.

(56) References Cited

U.S. PATENT DOCUMENTS 5,892,785 A * 4/1999 Nagai .................... 372/46.013
6,031,858 A 2/2000 Hatakoshi et al.
2002/0117680 A1 * 8/2002 Yabusaki et al. ............ 257/101
2004/0252739 A1 * 12/2004 Takeuchi et al. .............. 372/46

FOREIGN PATENT DOCUMENTS

| JP | 9-232678 | | 9/1997 |
| JP | 10-294529 | | 11/1998 |
| JP | 11-251678 | * | 9/1999 |

* cited by examiner

*Primary Examiner*—Minsun Harvey
*Assistant Examiner*—Xnning Niu
(74) *Attorney, Agent, or Firm*—Sonnenschein Nath & Rosenthal LLP

(57) ABSTRACT

To provide a semiconductor light emitting device capable of improving an aspect ratio of a laser beam to make it close to a circular shape and a method of producing the same, a first conductive type first cladding layer 11, an active layer 12, and a second conductive type second cladding layer 17 having a ridge-shaped portion RD as a current narrowing structure are stacked on a substrate 10; wherein the ridge-shaped portion includes a first ridge-shaped layer 15 on the side close to said active layer and having a high bandgap and a second ridge-shaped layer 16 on the side distant from the active layer and having a low bandgap, so that the semiconductor light emitting device is obtained. By using an epitaxial growth method, a first cladding layer, active layer and second conductive type second cladding layer are formed by being stacked on the substrate, a part of the second cladding layer is processed to be a ridge-shaped portion, and the second cladding layer is formed, so that the portion to be a ridge shape includes the first ridge-shaped layer and second ridge-shaped layer.

21 Claims, 7 Drawing Sheets

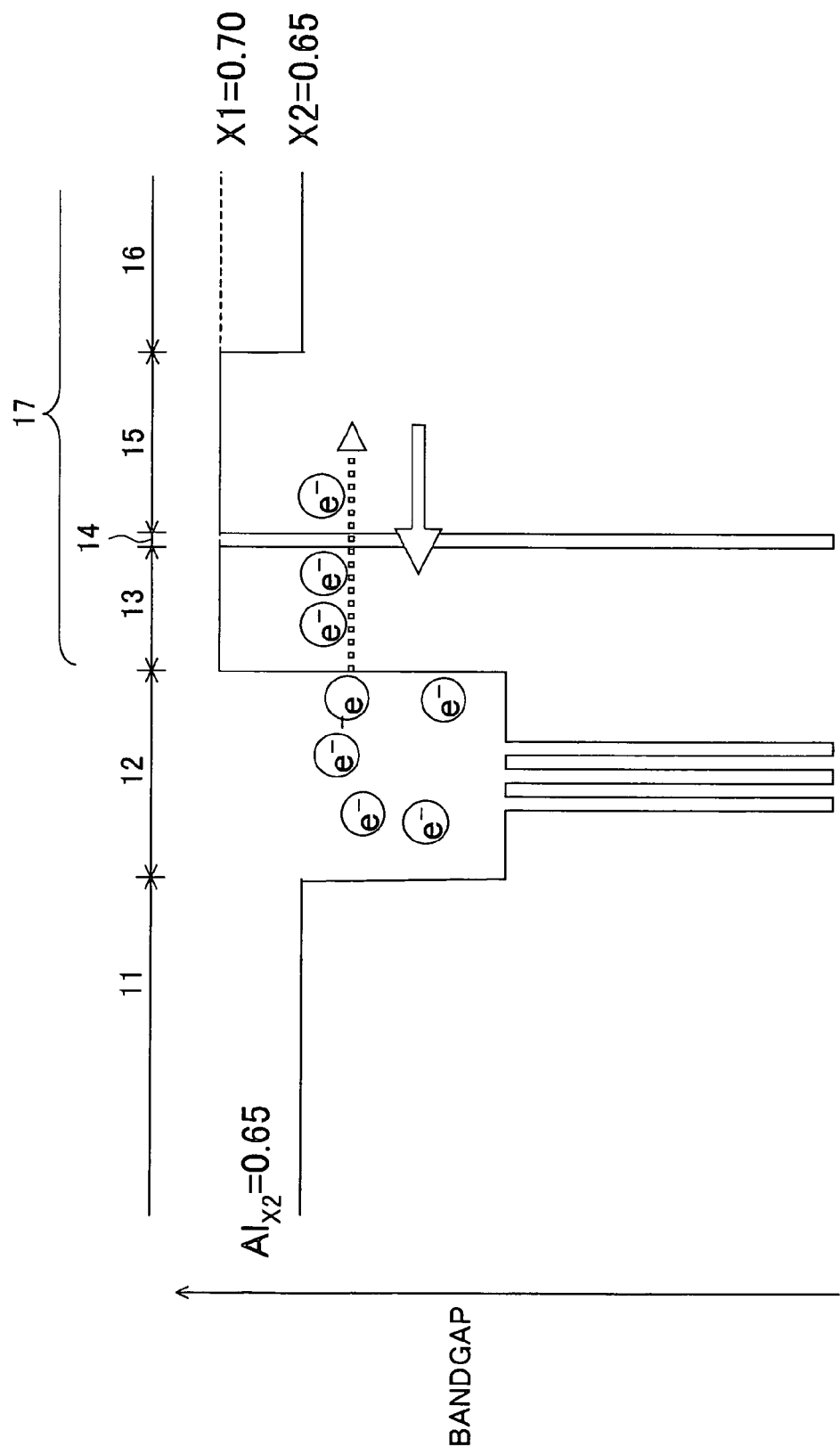

SEMICONDUCTOR LIGHT EMITTING DEVICE AND METHOD OF PRODUCING THE SAME

TECHNICAL FIELD

The present invention relates to a semiconductor light emitting device and a method of producing the same, and particularly relates to a semiconductor light emitting device with an improved beam shape and a method of producing the same.

BACKGROUND ART

A semiconductor laser and other semiconductor light emitting device are used, for example, as a CD (compact disc) and DVD (digital versatile disc), furthermore, a light source of an optical pickup device of next-generation optical disc devices and a light source of other apparatuses in a variety of fields.

As the above semiconductor light emitting device, for example, a semiconductor laser made by an AlGaInP-based material is disclosed in the non-patent article 1.

FIG. 1A is a sectional view of the semiconductor laser explained above.

For example, an n-type cladding layer 111 formed by an AlGaInP layer, an active layer 112, a p-type cladding layer 117 formed by AlGaInP layers (113 and 115) and a p-type cap layer 118 formed by a GaAs layer are formed by being stacked on an n-type substrate 110 via a not shown n-type buffer layer.

An etching stop layer 114 of a GaInP layer is formed on a boundary face of the AlGaInP layer 113 and the AlGaInP layer 115, and a portion from a surface of the p-type cap layer 118 to the AlGaInP layer 115 is processed to be a ridge (protrusion) shape RD so as to form a stripe as a current narrowing structure.

Current block layers 119 are formed on both sides of the ridge shape RD and, furthermore, a p-electrode 120 is formed to be connected to the p-type cap layer 118 and an n-electrode 121 is formed to be connected to the n-type substrate 110.

FIG. 1B is a view of a bandgap profile of a section along $x_1$-$x_2$ in FIG. 1A.

It shows a bandgap of each of the n-type cladding layer 111, active layer 112, AlGaInP layer 113, etching stop layer 114 and AlGaInP layer 115.

For example, a composition ratio of aluminum in the n-type cladding layer 111 is 0.65, while that in both of the AlGaInP layers (113 AND 115) is 0.70 and p-type cladding layers are configured to have a higher bandgap than that of the n-type cladding layer 111.

In the above semiconductor laser, to adjust an aspect ratio of the laser beam and bring the beam shape close to a circular shape is one of significant tasks.

The beam shape largely depends on a refractive index of each layer composing the semiconductor laser.

On the other hand, in the conventional semiconductor laser explained above, a variety of attempts have been made to improve the internal quantum efficiency and two leakage currents are required to be minimum.

A first leakage current is a lateral direction leakage current $I_{Lx}$, which leaks excessively in the X-direction parallel to a hetero junction in the sectional view in FIG. 1. A second leakage current is a longitudinal direction leakage current $I_{Ly}$, called an overflow, wherein electrons leak in the Y-direction from the active layer to the p-cladding layer.

There is a method of controlling the $I_{Lx}$ by making a thickness of the AlGaInP layer 113 in FIG. 1 thin, however, it is actually difficult to make the AlGaInP layer 113 thin by controlling to 300 nm or thinner.

For example, a difference of an effective refractive index $N_{\mathit{eff}1}$ at the center of the ridge stripe and an effective refraction index $N_{\mathit{eff}2}$ outside of the ridge stripe becomes large, light confinement in the X-direction intensifies, a photon distribution at the center in the X-direction is maximized, and electron-hole consumption increases to be short in supply. This is called hole-burning of carriers and photons are unable to be supplied with electron holes to maintain the mode at this time, so that they tend to shift to a mode of receiving the supply. This phenomenon leads to a change of electron-light conversion efficiency thereof, and linearity of the light output—current (L-I) characteristic is deteriorated, which is observed as a phenomenon called kink.

Also, in the conventional semiconductor laser explained above, electrons leak as a longitudinal direction leakage current $I_{Ly}$ from the active layer to the p-type cladding layer due to the thermal electron energy when at a high temperature and deterioration of the L-I characteristics is caused.

As a nature of countermeasures thereof, a method of heightening a height of an energetic barrier sensed by electrons belonging to a Γ-band and a method of improving concentration of a p-type impurity of the cladding layer have been general. At this time, it is known that a drift current of an electron group belonging to an X-band increases when the AlGaInP layer 113 is made thinner as a significant task (refer to the non-patent article 1).

This can be confirmed also by an experiment and the AlGaInP layer 113 cannot be made very thin, so that a method of controlling the leakage current $I_{Lx}$ in the X-direction explained above cannot be used.

Non-Patent Article 1: Numerical Simulation of Semiconductor Optoelectronic Devices, proceedings, MD4, L39-40

Non-Patent Article 2: IEEE JQE, vol. 38, No. 3, March 2002, L285.

DISCLOSURE OF THE INVENTION

Problem to be Solved by the Invention

A problem to be solved is a point that it is difficult to improve an aspect ratio of a laser beam to make it close to a circular shape in a semiconductor laser having the configuration shown in FIG. 1.

Means to Solve the Problem

A semiconductor light emitting device of the present invention comprises a substrate; a first conductive type first cladding layer formed on the substrate; an active layer formed on the first cladding layer; and a second conductive type second cladding layer formed on the active layer, a part thereof having a ridge-shaped portion as a current narrowing structure; wherein said ridge-shaped portion of the second cladding layer includes a first ridge-shaped layer on the side close to the active layer and having a high bandgap and a second ridge-shaped layer on the side distant from the active layer and having a low bandgap.

In the above semiconductor light emitting device, a first conductive type first cladding layer, an active layer and a second conductive type second cladding layer having a ridge-shaped portion as a current narrowing structure are stacked on a substrate. The second cladding layer of the ridge-shaped portion is configured to include a first ridge-shaped layer on the side close to the active layer and having a high bandgap and a second ridge-shaped layer on the side distant from the active layer and having a low bandgap.

Also, a method of producing a semiconductor light emitting device of the present invention includes a step of forming at least a first conductive type first cladding layer, an active layer and a second conductive type second cladding layer by stacking on a substrate by an epitaxial growth method; and a step of processing a ridge-shaped portion as a current narrowing structure at a part of the second cladding layer; wherein, in the step of forming the second cladding layer, a portion to be said ridge-shaped portion is formed to include a first ridge-shaped layer on the side close to the active layer and having a high bandgap and a second ridge-shaped layer on the side distant from the active layer and having a low bandgap.

In the above method of producing a semiconductor light emitting device of the present invention, at least a first conductive type first cladding layer, an active layer and a second conductive type second cladding layer are formed by being stacked on a substrate by an epitaxial growth method and, next, a part of the second cladding layer is processed to be a ridge-shaped portion as a current narrowing structure.

Here, when forming the second cladding layer, the portion to be the ridge-shaped portion is formed to include a first ridge-shaped layer on the side close to the active layer and having a high bandgap and a second ridge-shaped layer on the side distant from the active layer and having a low bandgap.

EFFECT OF THE INVENTION

The semiconductor light emitting device of the present invention has the configuration that the ridge-shaped portion of the second cladding layer includes a high bandgap layer and a low bandgap layer, consequently, the configuration that the ridge-shaped portion of the second cladding layer includes a layer with a low refractive index and a layer with a high refractive index is attained, so that a refractive index profile to affect a beam shape of an emitted light can become adjustable and the aspect ratio of the beam can be improved to be close to a circular shape.

According to the method of producing the semiconductor light emitting device of the present invention, the ridge-shaped portion of the second cladding layer is formed to include a high bandgap layer and a low bandgap layer, so that a refractive index profile to affect a beam shape of an emitted light can become adjustable and the aspect ratio of the beam can be improved to be close to a circular shape.

BRIEF DESCRIPTION OF DRAWINGS

[FIG. 1]

[FIG. 2]

[FIG. 3] FIG. 3 is a schematic view for explaining an effect of reducing drift electrons in the first embodiment of the present invention.

FIG. 4 is a view showing a result of measuring a threshold current of a semiconductor laser of an example and a comparative example in example 1.

FIG. 5 is a view showing results of measuring $\theta\perp$ of a semiconductor laser of an example and a comparative example in example 2.

FIG. 6 is a view showing a result of measuring a differential efficiency of a semiconductor laser of an example and a comparative example in example 3.

FIG. 7 is a view showing a result of measuring a kink level of a semiconductor laser of an example and a comparative example in example 4.

FIG. 8 is a view wherein a reduction rate KSEp of a differential coefficient is plotted with respect to a half width $\theta//$ of a far-field pattern.

[FIG. 9]

EXPLANATION OF REFERENCES

10 . . . n-type substrate, 11 . . . n-type cladding layer (first cladding layer), 12 . . . active layer, 13 . . . d2 layer, 14 . . . etching stop layer, 15 . . . d2' layer (first ridge-shaped layer), 16 . . . second ridge-shaped layer, 17 . . . p-type cladding layer (second cladding layer), 18 . . . p-type cap layer, 19 . . . current block layer, 20 . . . p-electrode, 21 . . . n-electrode, 110 . . . n-type substrate, 111 . . . n-type cladding layer, 112 . . . active layer, 113 . . . AlGaInP layer p-type cladding layer, 114 . . . etching stop layer, 115 . . . AlGaInP layer, 117 . . . p-type cladding layer, 118 . . . p-type cap layer, 119 . . . current block layer, 120 . . . p-electrode, 121 . . . n-electrode

BEST MODE FOR CARRYING OUT THE INVENTION

Below, embodiments of a semiconductor light emitting device of the present invention will be explained with reference to the drawings.

First Embodiment

Figure 2A:
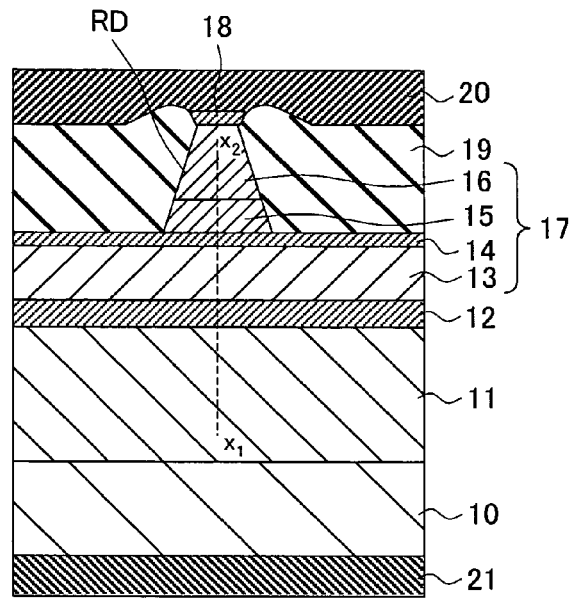
FIG. 2A is a sectional view of a semiconductor laser as a semiconductor light emitting device according to a first embodiment of the present invention.

FIG. 2A is a sectional view of a semiconductor laser as a semiconductor light emitting device according to the present embodiment.

For example, on an n-type substrate 10, an n-type cladding layer (first cladding layer) 11 formed by an AlGaInP layer, an active layer having the multiquantum well structure, a d2 layer 13 formed by an AlGaInP layer, an etching stop layer 14 formed by a GaInP layer, a d2' layer (first ridge-shaped layer) 15 formed by an AlGaInP layer and a second ridge-shaped layer 16 formed by an AlGaInP layer are stacked via a not shown n-type buffer layer, wherein a portion from the d2 layer 13 to the second ridge-shaped layer 16 becomes a p-type cladding layer (second cladding layer) 17. Furthermore, a p-type cap layer 18 formed by a GaAs layer is formed on the second ridge-shaped layer 16.

Also, a portion from a surface of the p-type cap layer 18 to the AlGaInP layer 15 is processed to be a ridge (protrusion) shape RD to form a stripe having a current narrowing structure, and a current block layer 19 formed, for example, by AlInP, etc. is formed on both sides of the ridge shape RD.

Also, a p-electrode 20 is formed to be connected to the p-type cap layer 18, and an n-electrode 21 is formed to be connected to the n-type substrate 10.

Figure 2B:
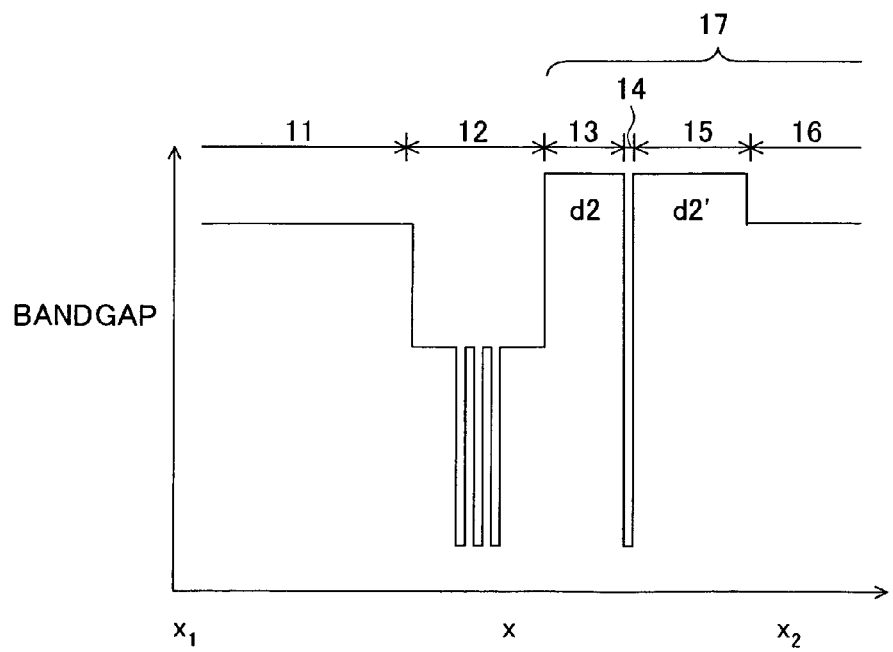
FIG. 2B is a bandgap profile on a section along $x_1$-$x_2$ in FIG. 2A.

FIG. 2B is a bandgap profile on the section along $x_1$-$x_2$ in FIG. 2A.

It shows a bandgap of each of the n-type cladding layer 11, active layer 12, d2 layer 13, etching stop layer 14, d2' layer (first ridge-shaped layer) 15 and second ridge-shaped layer 16. Here, the height of the bandgap corresponds to the height of the composition ratio of aluminum, and the higher the composition ratio of aluminum is, the higher the bandgap becomes.

For example, a composition ratio of aluminum of the n-type cladding layer 11 is 0.65, while in the p-type cladding layer, those of the d2 layer 13 and d2' layer (first ridge-shaped layer) 15 are 0.70 and that of the second ridge-shaped layer 16 is 0.65. Namely, in the n-type cladding layer 11 and the p-type cladding layer 17, the profile is, for example, bandgaps of the n-type cladding layer 11 and the second ridge-shaped layer 16 are low and bandgaps of the d2 layer and the d2' layer (first ridge-shaped layer) 15 are high.

As explained above, in the semiconductor laser of the present embodiment, the ridge-shaped portion (d2' layer (first ridge-shaped layer) 15 and second ridge-shaped layer 16) of the p-type cladding layer (second cladding layer) 17 is configured to include the d2' layer (first ridge-shaped layer) 15 with a high bandgap on the side close to the active layer 12 and the second ridge-shaped layer 16 with a low bandgap on the side distant from the active layer 12.

Also, in the p-type cladding layer 17, the portion of the d2 layer 13 and the d2' (first ridge-shaped layer) 15 is configured to have a higher bandgap than that of the n-type cladding layer 11.

Also, the height of the aluminum composition ratio corresponds to the height of the refractive index, and the higher the aluminum composition ratio is, the lower the refraction ratio is. Accordingly, the profile is, for example, refraction indexes of the n-type cladding layer 11 and the second ridge-shaped layer 16 are high and those of the d2 layer 13 and the d2' (first ridge-shaped layer) 15 are low, that is, the d2' layer (first ridge-shaped layer) 15 is configured to be formed by a layer having the same refraction index as that of the d2 layer 13 as a portion excepting the ridge-shaped portion of the p-type cladding layer (second cladding layer) 17.

In a semiconductor laser as the semiconductor light emitting device according to the above present embodiment, as a result of applying a predetermined voltage to the p-electrode 20 and the n-electrode 21, a laser beam having a wavelength of, for example, 650 nm band is emitted from the laser beam emitting portion in the direction parallel to the substrate.

The above semiconductor laser may be an index guide and self pulsation type, etc. by controlling a depth and shape, etc. of the ridge.

The semiconductor light emitting device according to the above explained present embodiment has the configuration that the ridge-shaped portion of the p-type cladding layer (second ridge-shaped layer) includes a high bandgap layer and a low bandgap layer, consequently, the configuration that the ridge-shaped portion of the second cladding layer includes a layer with a low refractive index and a layer with a high refractive index is attained, so that a refractive index profile to affect a beam shape of an emitted light can become adjustable, for example, a half width ($\theta\perp$) of a far-field pattern beam in the vertical direction with respect to the hetero junction becomes small, and the aspect ratio of the beam can be improved to generate a beam pattern closer to a circular shape.

In the semiconductor laser of the present embodiment, it is preferable that a composition ratio X1 of aluminum in the d2' layer (first ridge-shaped layer) 15 satisfies $0.60 \leq X1 \leq 0.70$ and a composition ratio X2 of aluminum in the second ridge-shaped layer 16 satisfies $X2 \leq X1$.

By attaining this configuration, a film thickness of the d2 layer 13 as a portion excepting the ridge-shaped portion of the p-cladding (second cladding) layer having a high aluminum composition ratio can be made as thin as 50 to 350 nm, as a result, the current $I_{Lx}$ leaking excessively in the direction parallel to the hetero junction can be reduced.

As explained above, in the configuration of the present embodiment, as a result that the ridge portion is configured to include the d2' layer (first ridge-shaped layer) 15 as a low refractive index layer and the second ridge-shaped layer 16 as a high refractive index layer, even when the d2 layer 13 is made thin as 50 to 350 nm, a threshold current (threshold carrier density) of the semiconductor laser can be reduced, an overflow of electrons from the active layer to the p-side, which has been a problem, can be suppressed, and the differential efficiency and kink level can be improved.

In the present embodiment, to correct the thinness of the d2 layer 13, the d2' layer (first ridge-shaped layer) 15 having a high Al composition ($0.60 \leq X1$ 0.70) is introduced, and the thickness can be made as thick as 50 to 400 nm.

Theoretically, electrons overflowed from the active layer 12 may pass through the d2 layer 13 via an X-band to rejoin at the etching stop layer 14, while, a reduction of a threshold current value and an improvement effect of a temperature characteristic, etc. were observed due to an effect of the d2' layer (first ridge-shaped layer) 15 by way of experiment.

In the case where the d2' layer (first ridge-shaped layer) 15 having a high aluminum composition ratio is not formed, when the d2 layer 13 as a portion excepting the ridge-shaped portion of the p-cladding layer (second cladding layer) is made thin in order to aim the above effects, it is liable that an electron group belonging to the X-band passes through the d2 layer, acts as drift electrons, leaks to the p-type cladding layer and adversely leads to a deterioration of the temperature characteristic (refer to the non-patent article 2).

FIG. 3 is a schematic view for explaining an effect of reducing drift electrons in the present embodiment.

In the present embodiment, the ridge-shaped portion of the p-type cladding layer (second cladding layer) 17 is composed of the d2' layer (first ridge-shaped layer) 15 having a high bandgap and the second ridge-shaped layer 16 having a low bandgap. The d2' (first ridge-shaped layer) 15 is provided not to contact with a SCH (Separate Confinement Hetero-structure) guide layer of the active layer 12 and the d2 layer 13 and the etching stop layer 14 are provided between them, and it is confirmed by way of experiment that the effect of suppressing the drift electrons enhances as the thickness increases.

In an AlGaInP-based high-energy laser, a stripe width of a lower side of the trapezoidal ridge shape RD, a sectional view of which is as shown in FIG. 2A, has to be as narrow as 2.5 μm or less to improve the kink level. However, it is technically difficult to make the ridge shape upright and, when the stripe width of the lower side becomes narrow, the upper side of the ridge trapezoid becomes extremely narrow to cause a new disadvantage that the resistance becomes high.

In the semiconductor laser structure according to the present embodiment, the d2' layer (first ridge-shaped layer) 15 in the figure has a high Al composition on average than that in the second ridge-shaped layer 16 formed above it. Therefore, in a wet etching step for producing the ridge shape in the figure, an etching rate of the d2' layer (first ridge-shaped layer) 15 becomes faster than that of the second ridge-shaped layer 16.

Consequently, etching proceeds faster at the lower portion of the ridge shape RD, so that the stripe width of the lower side can be made narrower by 0.2 μm or so comparing with that in the case of producing the same upper side. Namely, the ridge shape can be more upright comparing with that in the conventional cases, so that the kink level improves.

From the above reason, a film thickness of the d2 layer 13 is preferably 50 to 350 nm or so. When it exceeds 350 nm, the current ILx leaking excessively in the direction parallel to the hetero junction increases, which is unfavorable.

Also, a sum of film thicknesses of the d2 layer 13 and the d2' (first ridge-shaped layer) 15 is preferably 750 nm or smaller. When exceeding 750 nm, θ⊥ of the beam declines.

Also, a film thickness of the d2' (first ridge-shaped layer) layer 15 is preferably 50 to 400 nm or so. This is for the sum of film thicknesses of the d2 layer 13 and the d2' (first ridge-shaped layer) 15 not to exceed 750 nm as explained above.

EXAMPLE 1

Figure 1A:
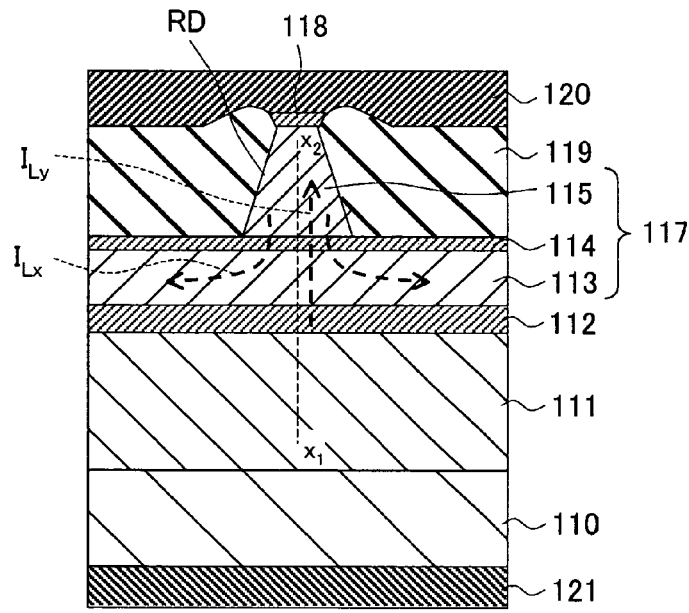
FIG. 1A is a sectional view of a semiconductor laser as a semiconductor light emitting device according to a conventional example.
Figure 1B:
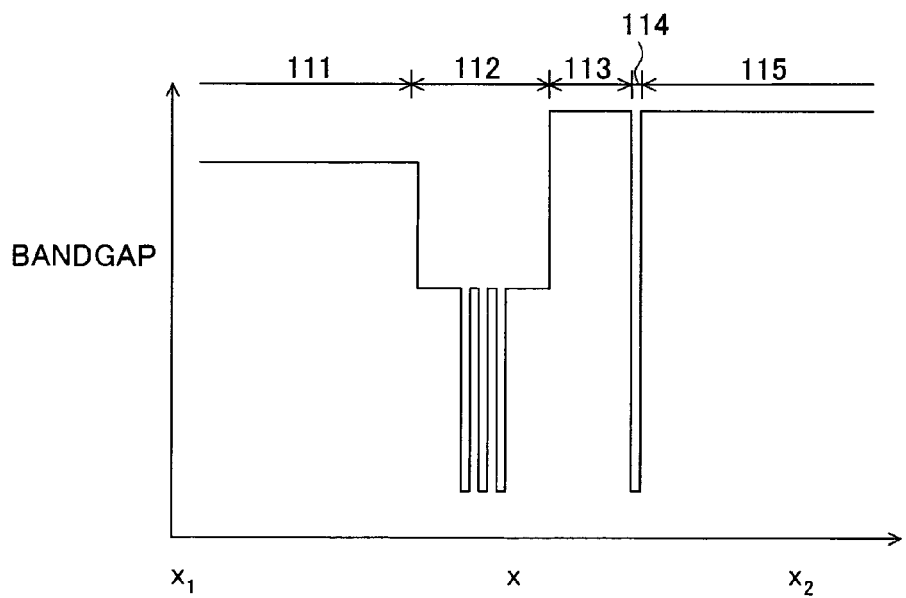
FIG. 1B is a view of a bandgap profile on a section along $x_1$-$x_2$ in FIG. 1A.

A semiconductor laser having the configuration shown in FIG. 2 was produced as an example by following the above embodiment, and a semiconductor laser having the configuration shown in FIG. 1 was produced as a comparative example. A threshold current was measured on both of the semiconductor lasers.

Figure 4:
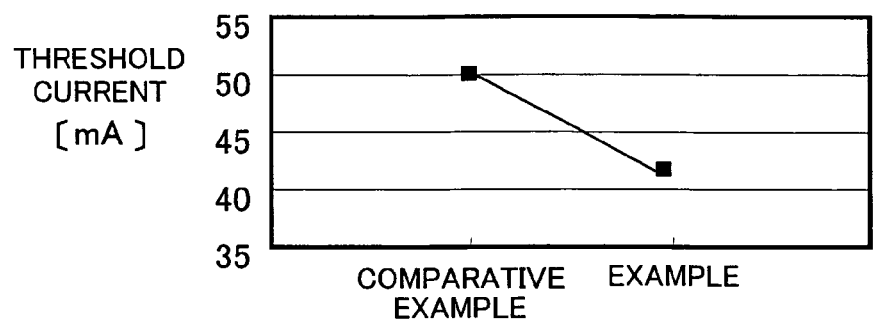
[FIG. 4]

The results are shown in FIG. 4.

A lower threshold current was obtained in the semiconductor laser of the example than that of the comparative example.

EXAMPLE 2

In the same way as in the example 1, a semiconductor laser as an example and that as a comparative example were produced, a far-field pattern in the vertical direction with respect to the hetero junction was observed on both of the semiconductor lasers and the θ⊥ was measured.

Figure 5:
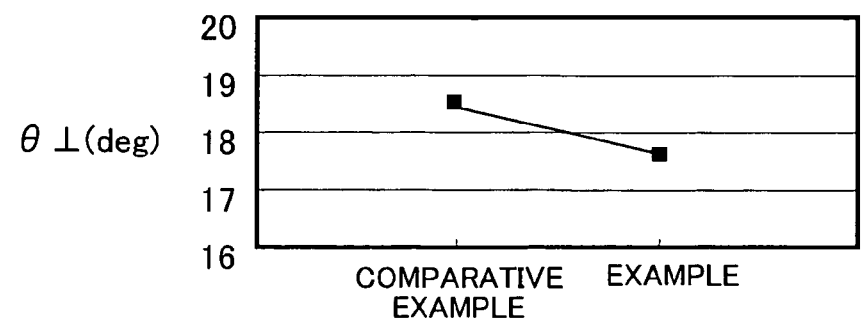
[FIG. 5]

The results are shown in FIG. 5.

A smaller θ⊥ value was obtained in the semiconductor laser as the example than that of the comparative example.

EXAMPLE 3

In the same way as in the example 1, a semiconductor laser as an example and that as a comparative example were produced, and a differential efficiency was measured on both of the semiconductor lasers.

Figure 6:
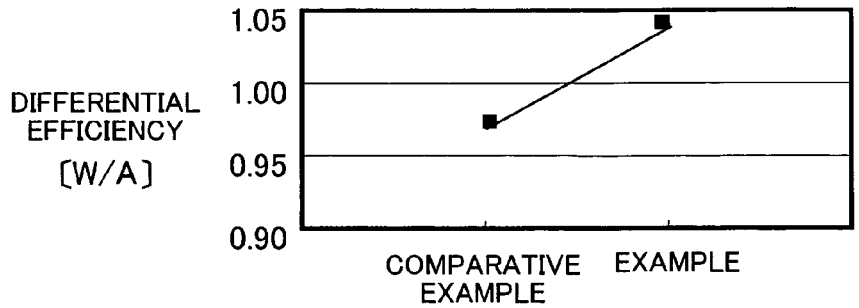
[FIG. 6]

The results are shown in FIG. 6.

A larger differential efficiency value was obtained in the semiconductor laser as the example than that of the comparative example.

EXAMPLE 4

In the same way as in the example 1, a semiconductor laser as an example and that as a comparative example were produced, a kink level (100 ns, 70° C.) was measured on both of the semiconductor lasers.

Figure 7:
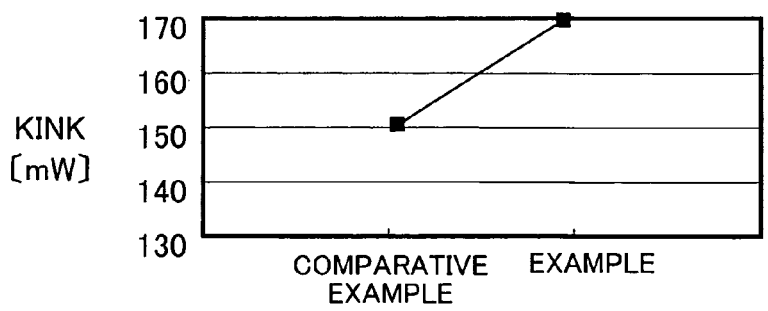
[FIG. 7]

The results are shown in FIG. 7.

The kink level was improved in the semiconductor laser as the example comparing with that in the comparative example.

EXAMPLE 5

In the same way as in the example 1, a semiconductor laser as an example and that as a comparative example were produced, and a reduction rate KSEp of a differential coefficient of the L-I curve and a half width θ// of a far-field pattern as an indication of light confinement of a light in the X-direction were measured on both of the semiconductor lasers. The larger the KSEp value is, the higher the tortuosity of L-I (arising of kink) is.

Figure 8:
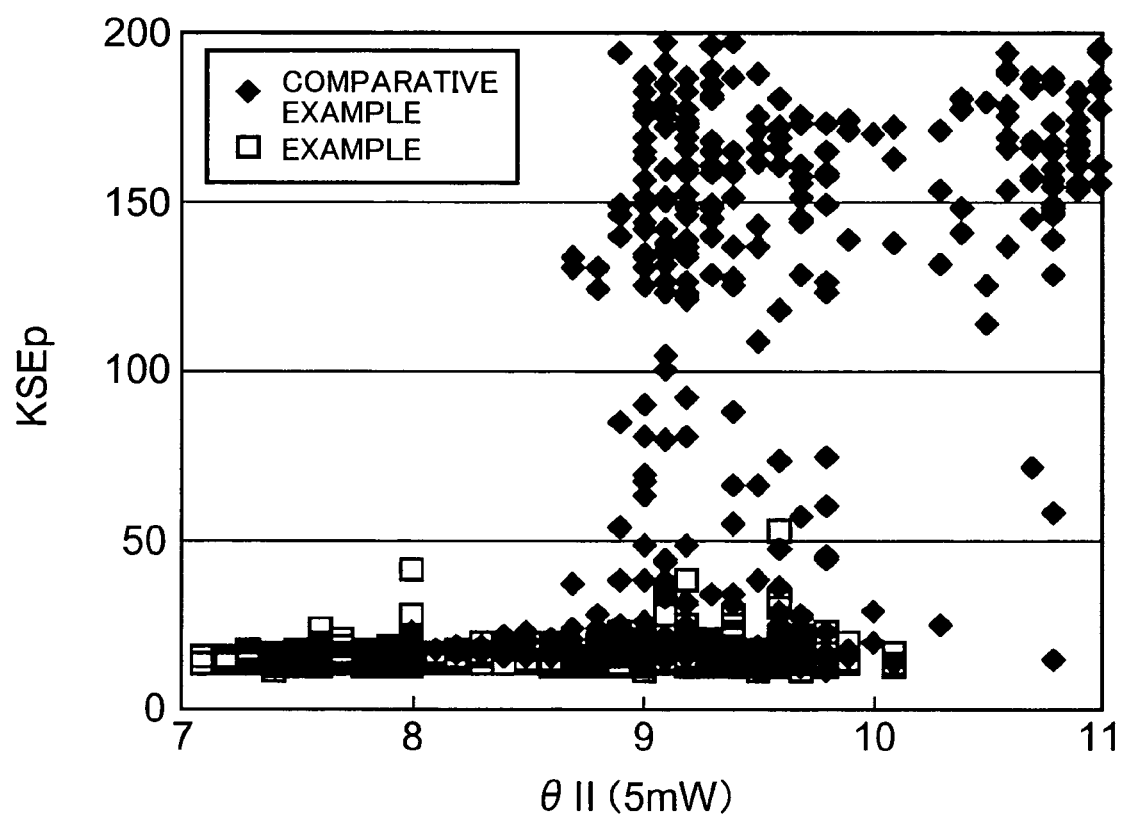
[FIG. 8]

FIG. 8 is a view wherein reduction rates KSEp of differential coefficients is plotted with respect to the half width θ// (output of 5 mW) of a far-field pattern.

In the comparative example, when the half width θ// of the far-field pattern is large, kink easily arises along with the hole burning effect.

In the example, the kink level does not decline even when the half width θ// of the far-field pattern becomes large.

This also contributes to an improvement of the aspect ratio of the beam to generate a more circular beam pattern as explained above, and the merit is significant in an optical disk application.

EXAMPLE 6

In the same way as in the example 1, a semiconductor laser as an example and that as a comparative example were produced, and an operation current value during an operation at a high temperature was measured on both of the semiconductor laser.

The semiconductor laser as the example exhibited a smaller operation current value in high temperature operation comparing with that of the comparative example.

A method of producing the semiconductor laser according to the present embodiment as above will be explained.

For example, by using an epitaxial growth method, such as an organic metal vapor epitaxial growth method (MOVPE), a not shown buffer layer, the n-type cladding layer (first cladding layer) 11 formed by an AlGaInP layer, the active layer 12, the d2 layer 13 formed by an AlGaInP layer, the etching stop layer 14 formed by a GaInP layer, the d2' layer (first ridge-shaped layer) 15 formed by an AlGaInP layer, the second ridge-shaped layer 16 formed by an AlGaInP layer and the p-type cap layer 18 formed by a GaAs layer are stacked in order on the n-type substrate 10. Here, a portion from the d2 layer 13 to the second ridge-shaped layer 16 becomes the p-type cladding layer (second cladding layer) 17.

Here, film formation is performed, so that, for example, a composition ratio of aluminum in the n-type cladding layer 11 is 0.65, those of the d2 layer 13 and d2' layer (first ridge-shaped layer) 15 as p-type cladding layers are 0.70, and that of the second ridge-shaped layer 16 is 0.65.

Namely, in a step of forming the p-type cladding layer (second cladding layer) 17, a layer having the same refraction index as that of a portion excepting the ridge-shaped portion of the second cladding layer is formed as the d2' (first ridge-shaped layer) 15.

Next, for example, AlInP, etc. is stacked allover the surface to form a current block layer 19, and a contact opening is formed, so that the p-type cap layer 18 is exposed.

Next, the p-electrode 20 made by Ti/Pt/Au, etc. is formed to be connected to the p-type cap layer 18, and the n-electrode 21 made by AuGe/Ni/Au, etc. is formed to be connected to the n-type substrate 10.

After that, through a pelletizing step, a desired semiconductor laser as shown in FIG. 2A can be obtained.

In the method of producing the semiconductor light emitting device of the present embodiment, since the ridge-shaped portion of the second cladding layer is formed to include a layer with a high bandgap and a layer with a low bandgap, the configuration that the ridge-shaped portion of the second cladding layer includes a layer with a low refractive index and a layer with a high refractive index is attained, so that a refractive index profile to affect a beam shape of an emitted light can become adjustable and the aspect ratio of the beam can be improved to be close to a circular shape.

In the above embodiment, an AlGaInP-based semiconductor light emitting device is explained, but the present embodiment is not limited to that and may be applied to an AlGaN-based semiconductor light emitting device.

The layer composition and the configuration can be same as those in the AlGaInP-based case in FIG. 2A. In this case, it is preferable that an aluminum composition ratio X1 of the d2' layer (first ridge-shaped layer) is $0.05 \leq X1 \leq 0.20$ and an aluminum composition ratio of layers, such as the second ridge-shaped layer, other than the d2' layer (first ridge-shaped layer) is $X2 \leq 0.20$. As a result, the same effects as those in the case of the AlGaInP-based semiconductor light emitting device can be obtained.

Second Embodiment

Figure 9A:
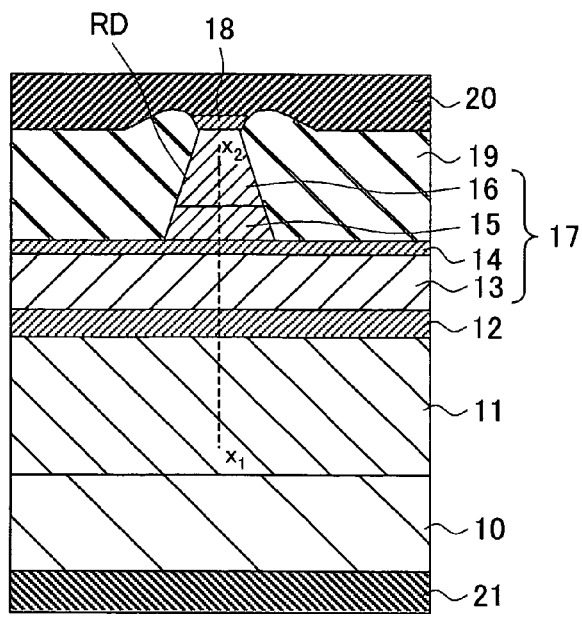
FIG. 9A is a sectional view of a semiconductor laser as a semiconductor light emitting device according to a second embodiment of the present invention.

FIG. 9A is a sectional view of a semiconductor laser as a semiconductor light emitting device according to the present embodiment.

A semiconductor laser according to the present embodiment has the same configuration as that in the first embodiment. For example, on an n-type substrate 10, an n-type cladding layer (first cladding layer) 11 formed by an AlGaInP layer, an active layer 12 having the multiquantum well structure, a d2 layer 13 formed by an AlGaInP layer, an etching stop layer 14 formed by a GaInP layer, a d2' layer (first ridge-shaped layer) 15 formed by an AlGaInP layer and a second ridge-shaped layer 16 formed by an AlGaInP layer are stacked via a not shown n-type buffer layer, wherein a portion from the d2 layer 13 to the second ridge-shaped layer 16 becomes a p-type cladding layer (second cladding layer) 17. Furthermore, a p-type cap layer 18 formed by a GaAs layer is formed on the second ridge-shaped layer 16.

Also, a portion from a surface of the p-type cap layer 18 to the AlGaInP layer 15 is processed to be a ridge (protrusion) shape RD to form a stripe having a current narrowing structure, and a current block layer 19 formed, for example, by AlInP, etc. is formed on both sides of the ridge shape RD.

Also, a p-electrode 20 is formed to be connected to the p-type cap layer 18, and an n-electrode 21 is formed to be connected to the n-type substrate 10.

Figure 9B:
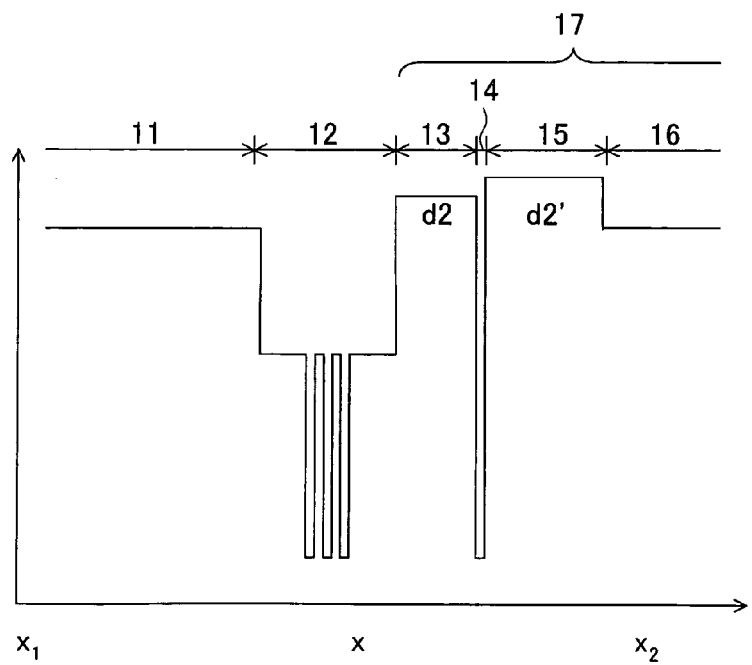
FIG. 9B is a view showing a bandgap profile on a section along $x_1$-$x_2$ in FIG. 9A.

FIG. 9B is a bandgap profile on the section along $x_1$-$x_2$ in FIG. 9A.

It shows a bandgap of each of the n-type cladding layer 11, active layer 12, d2 layer 13, etching stop layer 14, d2' layer (first ridge-shaped layer) 15 and second ridge-shaped layer 16. Here, the height of the bandgap corresponds to the height of the aluminum composition ratio, and the higher the aluminum composition ratio is, the higher the bandgap becomes.

In the semiconductor laser of the present embodiment, an aluminum composition ratio X0 of the d2 layer 13, an aluminum composition ratio X1 of the d2' layer (first ridge-shaped layer) 15, and an aluminum composition ratio X2 of the second ridge-shaped layer 16 as a ridge-shaped portion other than the d2' layer (first ridge-shaped layer) 15 satisfy $X2<X0<X1$. An aluminum composition ratio of the n-type cladding layer 11 is made equal to the aluminum composition ratio of the second ridge-shaped layer 16.

For example, the aluminum composition ratio in the n-type cladding layer 11 is 0.65, while in the p-type cladding layer, that in the d2 layer 13 is 0.68, that of the d2' layer (first ridge-shaped layer) 15 is 0.75 to 0.80 and that in the second ridge-shaped layer 16 is 0.65.

Namely, the n-type cladding layer 11 and the p-type cladding layer 17 has a profile that, for example, a bandgap is low in the n-type cladding layer 11 and the second ridge-shaped layer 16, a bandgap is high in the d2 layer 13, and a bandgap in the d2' layer (first ridge-shaped layer) 15 is still higher.

The semiconductor layer of the present embodiment is configured that the ridge-shaped portion (the d2' layer (first ridge-shaped layer) 15 and second ridge-shaped layer 16) of the p-type cladding layer (second cladding layer) 17 includes a d2' layer (first ridge-shaped layer) 15 on the side close to the active layer 12 and having a high band gap and a second ridge-shaped layer 16 on the side distant from the active layer 12 and having a low bandgap.

Also, a portion of the d2 layer 13 and the d2' layer (first ridge-shaped layer) 15 in the p-type cladding layer 17 is configured to have a higher bandgap than that of the n-type cladding layer 11.

Also, the height of the refraction index corresponds to the height of the aluminum composition ratio, and the higher the aluminum composition ratio, the lower the refractive index becomes.

Accordingly, with the above aluminum composition profile, a refraction index profile, that a refraction index of the n-type cladding layer 11 and that of the second ridge-shaped layer 16 are high, that of the d2 layer 13 is low and that of the d2' layer (first ridge-shaped layer) 15 is still lower, is obtained in the n-type cladding layer 11 and the p-type cladding layer 17.

Accordingly, the d2' layer (first ridge-shaped layer) 15 is configured to be composed of a layer with a lower refractive index than that of the d2 layer 13 as a portion excepting the ridge-shaped portion of the p-type cladding layer (second cladding layer) 17.

Other than the above, the semiconductor laser of the present embodiment is substantially the same as that in the first embodiment.

In the semiconductor laser as a semiconductor light emitting device according to the present embodiment explained above, by applying a predetermined voltage to the p-electrode 20 and the n-electrode 21, a laser beam having a wavelength of, for example, 650 nm band is emitted from the layer light emitting portion in the direction parallel to the substrate.

The above semiconductor laser may become an index guide and self pulsation type, etc. by controlling a depth and shape of the ridge.

The semiconductor light emitting device according to the present embodiment as above has the configuration that the ridge-shaped portion of the p-type cladding layer (second cladding layer) includes a high bandgap layer and a low bandgap layer, consequently, the configuration that the ridge-shaped portion of the second cladding layer includes a layer with a low refractive index and a layer with a high refractive index is attained, so that the refractive index profile to affect on the beam shape of the emitted light becomes adjustable, for example, the half width ($\theta\perp$) of the far-field pattern beam in the vertical direction with respect to the hetero junction becomes small, and the aspect ratio of the beam can be improved to generate a more circular beam pattern.

Particularly, as explained above, when with the refractive index profile that the refractive index of the n-type cladding layer 11 and that of the second ridge-shaped layer 16 are high, that of the d2 layer 13 is low, and that of the d2' layer (first ridge-shaped layer) 15 is still lower, a light distribution in the laser longitudinal direction can be designed at a higher degree of freedom, moreover, by adjusting the aluminum composition ratio of the second ridge-shaped layer 16 and film thicknesses of the d2 layer 13 and the d2' layer (first ridge-shaped layer) 15 and adjusting aluminum composition ratios of the di2 layer 13 and the d2' layer (first ridge-shaped layer) 15, the light distribution can be optimized and a spot of a laser beam to be emitted can be made closer to a perfect circle.

In the semiconductor laser according to the present embodiment, it is also preferable, as in the same way as in the first embodiment, a film thickness of the d2 layer 13 is 50 to 350 nm or so, a film thickness of the d2' layer (first ridgeshaped layer) 15 is 50 to 400 nm or so, and a sum of film thicknesses of the d2 layer 13 and the d2' layer (first ridge-shaped layer) 15 is 750 nm or smaller.

The semiconductor laser according to the present embodiment is capable of attaining the configuration that the aluminum composition ratio of the d2' layer (first ridge-shaped layer) 15 is furthermore higher than that in the first embodiment. Here, the higher the aluminum composition is, the faster the etching rate of processing a ridge shape, so that the etching rate ratio thereof to the etching stop layer 14 can be increased and it is possible to make the ridge shape more upright when processing the ridge shape comparing with that in the first embodiment, so that the kink level improves. Also, etching unevenness on a wafer surface of the cladding can be suppressed.

The semiconductor laser according to the present embodiment can be produced in the same way as that in the first embodiment by forming as the first ridge-shaped layer a layer having a lower refractive index than that of a portion excepting the ridge-shaped portion of the second cladding layer in the step of forming the second cladding layer.

The present invention is not limited to the above explanations.

For example, the present invention can be applied to an AlGaAs-based semiconductor light emitting device other than an AlGaInP-based and AlGaN-based semiconductor light emitting devices.

Other than that, a variety of modifications may be made within the scope of the present invention:

INDUSTRIAL APPLICABILITY

The semiconductor light emitting device of the present invention can be applied as a CD and a DVD, moreover, a light source of an optical pickup device of a next-generation optical disc apparatus and a light source of other apparatuses in a variety of fields.

The method of producing the semiconductor light emitting device of the present invention can be applied as a method for producing a CD and a DVD, moreover, a light source of an optical pickup device of a next-generation optical disc apparatus and a light source of other apparatuses.

The invention claimed is:

1. A semiconductor light emitting device, comprising:
a substrate;
a first conductivity type first cladding layer on said substrate;
an active layer on said first cladding layer; and
a second conductivity type second cladding layer on said active layer, a part thereof having a ridge-shaped portion as a current narrowing structure,
wherein,
said ridge-shaped portion of said second cladding layer includes a first ridge-shaped layer on the side closest to said active layer and having a higher bandgap than said first cladding layer and a second ridge-shaped layer on the side distant from the active layer and having a relatively low bandgap,
said first ridge-shaped layer and said second ridge-shaped layer are a layer with a relatively high aluminum composition ratio and a layer with a relatively low aluminum composition ratio, respectively,
an aluminum composition ratio X1 of said first ridge-shaped layer is $0.60<X1<0.70$, and
an aluminum composition ratio X2 of said second ridge-shaped layer is $X2<X1$.

2. A semiconductor light emitting device as set forth in claim 1, wherein:
an aluminum composition ratio X1 of said first ridge-shaped layer is 0.70, and
an aluminum composition ratio X2 of said second ridge-shaped layer is 0.65.

3. A semiconductor light emitting device as set forth in claim 1, wherein a film thickness of said first ridge shaped layer is 50 to 400 nm.

4. A semiconductor light emitting device as set forth in claim 1, wherein a sum of a film thickness of a portion excepting said ridge-shaped portion of said second cladding layer and a film thickness of said first ridge-shaped layer is 750 nm or smaller.

5. A semiconductor light emitting device as set forth in claim 1, wherein an etching stop layer is on a boundary face of a portion excepting the ridge-shaped portion of said second cladding layer and said first ridge-shaped layer.

6. A semiconductor light emitting device as set forth in claim 1, wherein said first cladding layer, said active layer and said second cladding layer comprises an AlGaInP-based material.

7. A semiconductor light emitting device as set forth in claim 1, wherein said first cladding layer, said active layer and said second cladding layer comprises an AlGaN-based material.

8. A semiconductor light emitting device as set forth in claim 1, wherein said first ridge-shaped layer comprises a layer having an equal refractive index to that of a portion excepting said ridge-shaped portion of said second cladding layer.

9. A semiconductor light emitting device as set forth in claim 1, wherein said first ridge-shaped layer comprises a layer having a lower refractive index than that of a portion excepting said ridge-shaped portion of said second cladding layer.

10. A semiconductor light emitting device as set forth in claim 9, wherein an aluminum composition ratio of said portion excepting said ridge-shaped portion of said second cladding layer is 0.68, and an aluminum composition ratio of said first ridge-shaped layer is 0.75 to 0.80.

11. A method of producing a semiconductor light emitting device, including:
a step of forming at least a first conductivity type first cladding layer, an active layer and a second conductivity type second cladding layer by stacking on a substrate by an epitaxial growth method; and
a step of processing a ridge-shaped portion as a current narrowing structure at a part of said second cladding layer,
wherein,
in the step of forming said second cladding layer, a ridge-shaped portion is formed to include a first ridge-shaped layer on the side close to said active layer and having a higher bandgap than said first cladding layer and a second ridge-shaped layer on the side distant from the active layer and having a relatively low bandgap,
in the step of forming said second cladding layer, a layer having a relatively high aluminum composition ratio and a layer having a relatively low aluminum composition ratio are formed as said first ridge-shaped layer and said second ridgeshaped layer, respectively, and
in the step of forming said second cladding layer, a layer having an aluminum composition ratio X1 satisfying $0.60<X1<0.70$ is formed as said first ridge-shaped layer and a layer having an aluminum composition ratio X2 of X2<X1 as said second ridge-shaped layer.

12. The method of producing a semiconductor light emitting device as set forth in claim 11, wherein in the step of forming said second cladding layer, a layer having an aluminum composition ratio X1 of 0.70 is formed as said first ridge-shaped layer and a layer having an aluminum composition ratio X2 of 0.65 is formed as said second ridge-shaped layer.

13. The method of producing a semiconductor light emitting device as set forth in claim 11, wherein in the step of forming said second cladding layer, said first ridge-shaped layer is formed to have a film thickness of 50 to 400 nm.

14. The method of producing a semiconductor light emitting device as set forth in claim 11, wherein in the step of forming said second cladding layer, a sum of a film thickness of a portion excepting said ridge-shaped portion of said second cladding layer and a film thickness of said first ridge-shaped layer is made to be 750 nm or smaller.

15. The method of producing a semiconductor light emitting device as set forth in claim 11, wherein in the step of forming said second cladding layer, an etching stop layer is formed on a boundary face of a portion excepting said ridge-shaped portion of said second cladding layer and said first ridge-shaped layer.

16. The method of producing a semiconductor light-emitting device as set forth in claim 15, wherein in the step of processing said ridge-shaped portion as the current narrowing structure at the part of said second cladding layer, the part of said second cladding layer is processed to be said ridge-shaped portion by etching which stops at said etching stop layer.

17. The method of producing a semiconductor light-emitting device as set forth in claim 11, wherein said first cladding layer, said active layer and said second cladding layer are formed by of AlGaInP-based material.

18. The method of producing a semiconductor light emitting device as set forth in claim 11, wherein said first cladding layer, said active layer and said second cladding layer are formed by of AlGaN-based material.

19. The method of producing a semiconductor light emitting device as set forth in claim 11, wherein in the step of forming said second cladding layer, a layer having a same refractive index as that of a portion excepting said ridge-shaped portion of said second cladding layer is formed as said first ridge shaped layer.

20. The method of producing a semiconductor light emitting device as set forth in claim 11, wherein in the step of forming said second cladding layer, a layer having a lower refractive index than that of a portion excepting said ridge-shaped portion of said second cladding layer is formed as said first ridge shaped layer.

21. The method of producing a semiconductor light emitting device as set forth in claim 20, wherein in the step of forming said second cladding layer, a layer having an aluminum composition ratio of 0.68 is formed as a portion excepting said ridge-shaped portion of said second cladding layer and a layer having an aluminum composition ratio of 0.75 to 0.80 is formed as said first ridge-shaped layer.

* * * * *